United States Patent
Sukegawa

(10) Patent No.: US 9,063,903 B2
(45) Date of Patent: Jun. 23, 2015

(54) MEMORY SYSTEM PROVIDED WITH NAND FLASH MEMORY AND METHOD INCLUDING SIMULTANEOUSLY WRITING DATA TO FIRST AND SECOND MEMORY ARRAYS

(75) Inventor: Hiroshi Sukegawa, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 117 days.

(21) Appl. No.: 13/531,894

(22) Filed: Jun. 25, 2012

(65) Prior Publication Data

US 2013/0080683 A1 Mar. 28, 2013

(30) Foreign Application Priority Data

Sep. 22, 2011 (JP) .................. 2011-208105

(51) Int. Cl.
*G06F 11/16* (2006.01)
*G06F 12/02* (2006.01)
*G06F 11/10* (2006.01)
*G06F 11/20* (2006.01)
*G11C 29/04* (2006.01)

(52) U.S. Cl.
CPC ........ G06F 11/1666 (2013.01); *G06F 12/0246* (2013.01); *G06F 2212/1044* (2013.01); *G06F 2212/7208* (2013.01); G06F 11/1048 (2013.01); *G06F 11/20* (2013.01); *G11C 2029/0411* (2013.01)

(58) Field of Classification Search
CPC . G06F 11/1666; G06F 11/1048; G06F 11/20; G06F 12/0246; G06F 2212/2022; G06F 2212/7208; G11C 2029/0411

USPC .......................................... 711/103
See application file for complete search history.

(56) References Cited

U.S. PATENT DOCUMENTS

| | | | |
|---|---|---|---|
| 6,549,469 B2* | 4/2003 | Gochi ................ | 365/189.14 |
| 6,834,322 B2 | 12/2004 | Sukegawa ............ | 711/103 |
| 8,090,918 B2* | 1/2012 | Fang et al. .......... | 711/162 |
| 2006/0198202 A1* | 9/2006 | Erez ................. | 365/185.29 |
| 2007/0198770 A1* | 8/2007 | Horii et al. .......... | 711/103 |
| 2008/0228996 A1* | 9/2008 | Tan et al. ............ | 711/103 |
| 2009/0164711 A1* | 6/2009 | Niwa ................. | 711/103 |
| 2009/0307414 A1 | 12/2009 | Sukegawa et al. ...... | 711/103 |
| 2012/0144134 A1* | 6/2012 | Niwa ................. | 711/155 |

FOREIGN PATENT DOCUMENTS

JP 2008-97403 4/2008

* cited by examiner

*Primary Examiner* — Sanjiv Shah
*Assistant Examiner* — Glenn Gossage
(74) *Attorney, Agent, or Firm* — Oblon, McClelland, Maier & Neustadt, L.L.P.

(57) ABSTRACT

A memory system includes first and second districts, and a control section. Each of the first and second districts includes a memory cell array. The control section receives a single write command to simultaneously write first data to the first and second districts. A memory controller may subsequently issue a read command to read the first data from one of the memory cell arrays to determine whether the read first data is normal or is correctable based on a result of error correction in an error correction circuit. When the read first data is normal or is correctable, the first data written to the other of the memory cell arrays may be deleted or nullified.

9 Claims, 4 Drawing Sheets

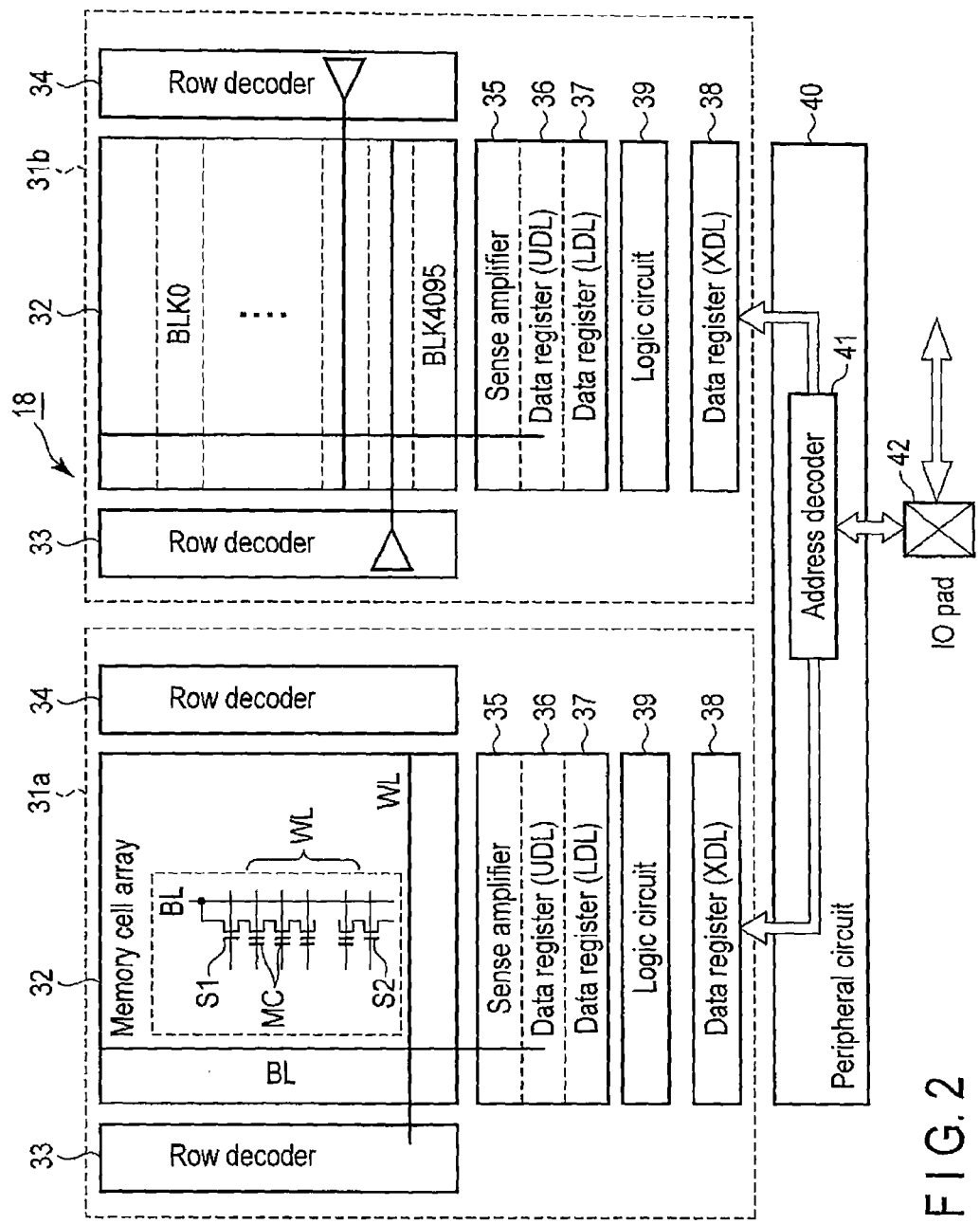
F I G. 2

MEMORY SYSTEM PROVIDED WITH NAND FLASH MEMORY AND METHOD INCLUDING SIMULTANEOUSLY WRITING DATA TO FIRST AND SECOND MEMORY ARRAYS

CROSS-REFERENCE TO RELATED APPLICATIONS

This application is based upon and claims the benefit of priority from prior Japanese Patent Application No. 2011-208105, filed Sep. 22, 2011, the entire contents of which are incorporated herein by reference.

FIELD

Embodiments described herein relate generally to a semiconductor memory device, for example, a memory system provided with a NAND flash memory, and method of controlling the same.

BACKGROUND

Recently, memory capacity of a NAND flash memory has increased, and the number of word lines in one chip has also increased.

In writing of data, an error in part of bits in one page selected by one word line can be corrected by using an error correction code (ECC). However, it is difficult to correct an error or omission in data in units of pages by using an ECC.

Accordingly, heretofore, in order to protect data in units of pages, data identical to the data to be written is written to an area different from the data to be written to thereby prepare a backup.

However, in order to record identical data such as the backup in a different area, it is necessary to write the identical data twice, and hence extra time has been required to write data, and the system throughput has been lowered. Thus, for this reason, a memory system enabling data to be written securely at high speed is desired.

BRIEF DESCRIPTION OF THE DRAWINGS

FIG. 2 is a block diagram showing part of the memory system of FIG. 1.

DETAILED DESCRIPTION

In general, according to one embodiment, a memory system includes first and second districts, and a control section. Each of the first and second districts includes a memory cell array. The control section receives addresses and a write command to simultaneously write first data to the first and second districts, and simultaneously writes the first data to the first and second districts.

Hereinafter, embodiments will be described with reference to the drawings.

First Embodiment

Figure 1:
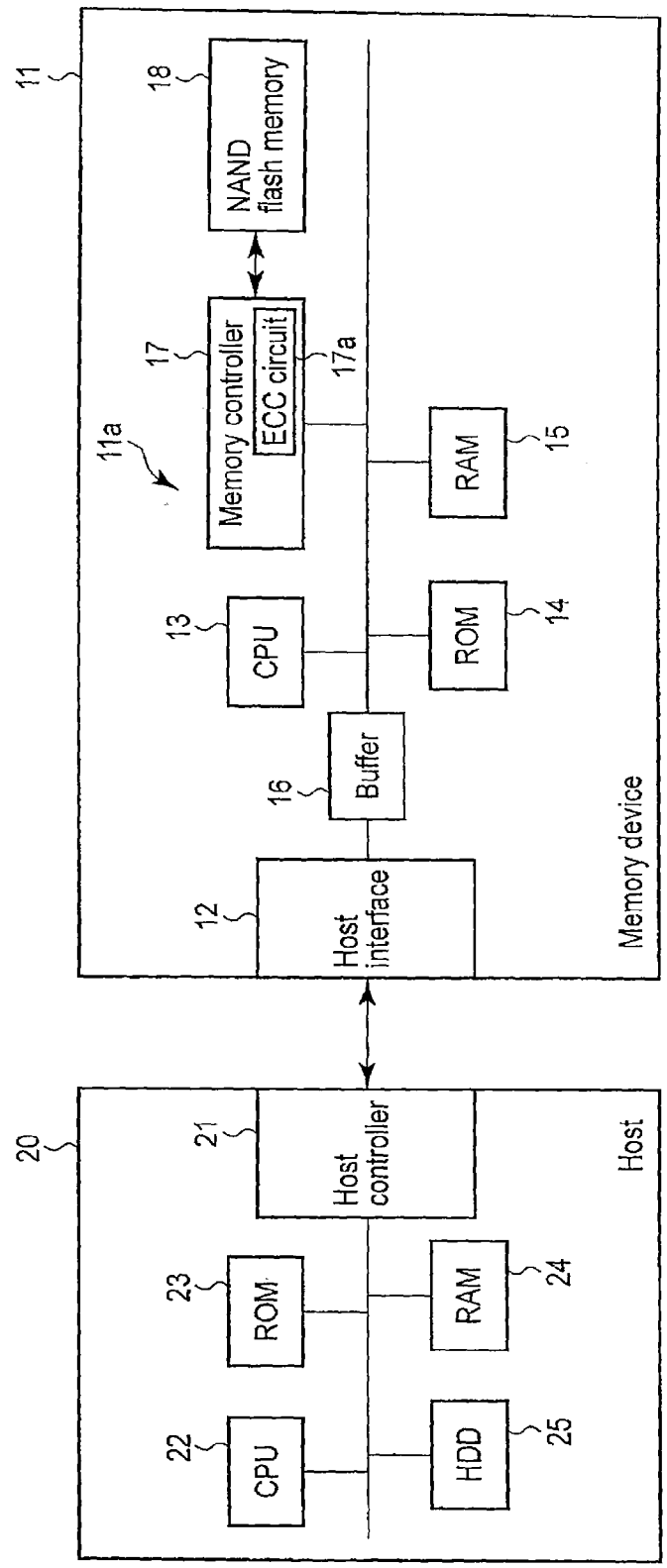
FIG. 1 is a block diagram schematically showing a memory system applied to an embodiment.

FIG. 1 schematically shows a memory system according to this embodiment.

The memory system is constituted of a memory device 11 such as an SD (Secure Digital) card, and host 20. It should be noted that the memory device 11 does not necessarily have a card-like shape, and may be incorporated in the host 20 in an undetachable manner. The host 20 is also called a host device.

Upon connection to the host 20, the memory device 11 receives power supply to operate, and carries out processing corresponding to an access from the host 20. The memory device 11 includes a card controller 11a.

The card controller 11a is constituted of, for example, a host interface 12, CPU (Central Processing Unit) 13, read-only memory (ROM) 14, random access memory (RAM) 15, and buffer 16. These are connected to each other by a bus. Furthermore, a memory controller 17 is connected to the bus. For example, a NAND flash memory 18 is connected to the memory controller 17.

The host interface 12 carries out interface processing between the card controller 11a and host 20.

The memory controller 17 carries out interface processing between the card controller 11a and NAND flash memory 18. Furthermore, the memory controller 17 includes an ECC circuit 17a, and subjects data supplied from the NAND flash memory 18 to error correction processing by means of the ECC circuit 17a.

The CPU 13 controls operations of the whole memory device 11. The CPU 13 receives a write command, read command, erase command, and the like from the host 20, and accesses an area on the NAND flash memory 18 or controls data transfer processing through the buffer 16.

The ROM 14 stores therein at least part of firmware such as a control program or the like used by the CPU 13. The RAM 15 is used as a work area of the CPU 13, and stores therein a control program, various tables, and an expanded register, described later.

The buffer 16 temporarily stores therein a certain amount of data (for example, data corresponding to one page) when data sent from the host 20 is written to, for example, the NAND flash memory 18, or temporarily stores therein a certain amount of data when data read from the NAND flash memory is sent to the host 20.

The NAND flash memory 18 is constituted of, for example, a memory cell of the stacked gate structure or a memory cell of the MONOS (Metal-Oxide-Nitride-Oxide Semiconductor) structure. The NAND flash memory stores therein system software or the like configured to control an operation of, for example, user data, application software or the card controller 11a. The user data, application software, and system software are managed by a file allocation table (FAT).

On the other hand, the host 20 can be, for example, a digital camera, cellular phone, personal computer, and the like. The host 20 is constituted of a host controller 21, CPU 22, ROM 23, RAM 24, and, for example, hard disk drive (HDD) 25 (including a solid state drive (SSD)). These are connected to each other by a bus.

The CPU 22 controls the whole host. The ROM 23 stores therein firmware necessary for the operation of the CPU 22. Although the RAM 24 is used as, for example, the work area of the CPU 22, a program which can be executed by the CPU 22 is also loaded here in the RAM 24 to be executed. The hard disk 25 retains various data items. The host controller 21 carries out interface processing between the host and memory device 11 in a state where the memory device is connected thereto. That is, the host controller 21 issues various commands to be described later in accordance with instructions of the CPU 22.

FIG. 2 shows an example of the NAND flash memory 18 shown in FIG. 1. The NAND flash memory 18 is constituted of, for example, first and second districts 31a, and 31b. The first and second districts 31a and 31b have the identical configuration, and hence the first district 31a will be described and, in the second district 31b, parts identical to those of the first district 31a are denoted by identical reference symbols, and a description of them is omitted.

In the first district 31a, a memory cell array 32 includes, as will be described later, a plurality of blocks BLK0 to BLK4095. Each block is constituted of a plurality of NAND strings. Each NAND string includes a plurality of memory cells MC connected in series, and selection transistors S1 and S2 configured to connect the NAND string to a bit line, and source line (not shown). A control gate of each memory cell is connected to a word line WL.

Each word line WL is connected to row decoders 33 and 34, and a word line is selected by the row decoders 33 and 34.

Further, each bit line BL is connected to a sense amplifier 35. Each sense amplifier 35 is connected to each of a plurality of data registers 36, 37, and 38, and a logic circuit 39. Each sense amplifier 35 detects a voltage of the bit line BL at the time of write, verify, and read of data. The plurality of data registers 36, 37, and 38 hold data to be written to the memory cell at the time of write, and verify of the data, and hold data read from the memory cell at the time of read of the data. Each of the sense amplifiers 35, data registers 36, 37, and 38 is made able to hold data of one page. The logic circuit 39 carries out operations such as data transfer between the data registers 36, 37, and 38, and data inversion or the like at the time of data write or data read.

Furthermore, a peripheral circuit 40 is common-connected to the first and second districts 31a and 31b. The peripheral circuit 40 includes, for example, an address decoder 41. The address decoder 41 is connected to an JO (Input Output) pad 42, decodes an address supplied from the JO pad 42, and supplies the decoded address to one of the first and second districts 31a and 31b.

Figure 3:
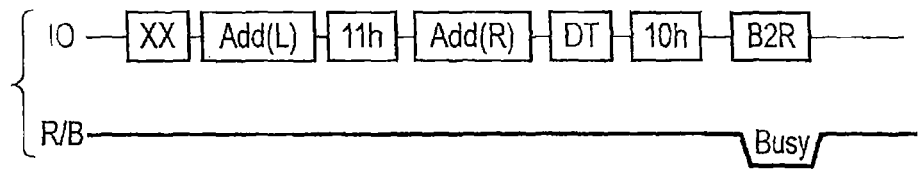
FIG. 3 is a view showing an example of a command sequence according to a first embodiment.

FIG. 3 shows an example of a command sequence according to the first embodiment.

In the first embodiment, it is made possible to simultaneously write the same data to the first and second districts 31a and 31b. Accordingly, a particular write command XX is defined. The symbol "XX" is an identifier of the command, and is not limited to "XX". It is sufficient if the identifier is a symbol or a numeral identifiable in the memory system.

Hereinafter, an operation to be carried out when the memory device 11 receives a "command to duplex the same data to store" from the host device 20 will be described below. The command to duplex the same data to store is input to the memory device 11 through the host interface 12. The CPU 13 interprets the command, and controls the NAND flash memory 18 in such a manner that the memory controller 17 simultaneously writes the same data to the first and second districts 31a and 31b.

Further, the host device 20 may attach a flag bit indicating that the data is important, and requires secure protection to the data to be input to the memory device 11. The CPU 13 interprets the flag bit, and carries out control in such a manner that the memory controller 17 simultaneously writes the same data to the first and second districts 31a and 31b.

Further, when the host device 20 successively inputs the same data to the memory device 11, the CPU may interpret this to carry out control in such a manner that the memory controller 17 simultaneously writes the same data to the first and second districts 31a and 31b.

The memory controller 17 first issues a command XX to simultaneously write the same data to the first and second districts 31a and 31b to the NAND flash memory 18 and, subsequently to this, outputs a page address Add (L) in the first district 31a. Subsequently, the memory controller 17 issues a command indicating that input of a page address is to be successively carried out, such as a command to switch the first or the second district 31a or 31b or a command 11h (h indicates a hexadecimal number) to the NAND flash memory 18. Thereafter, the memory controller 17 supplies a page address Add (R) in the second district 31b, write data DT, and command 10h in sequence to the NAND flash memory 18. The command 10h indicates, for example, the tail end of the command sequence. When the command 10h is issued, a ready/busy signal is set from a ready state to a busy state (B2R), and the data DT is simultaneously written to the page address Add (L) of the first district 31a, and page address Add (R) of the second district 31b.

Figure 4:
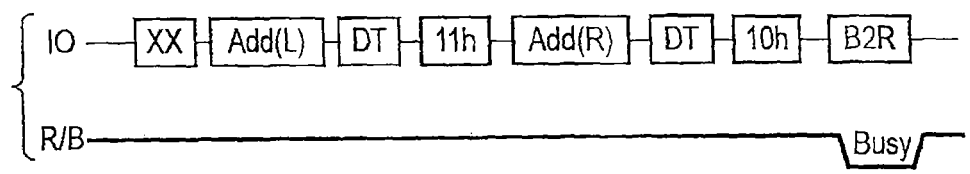
FIG. 4 is a view showing an example of a conventional command sequence.

FIG. 4 shows a conventional command sequence. In the command sequence shown in FIG. 3, after supplying the write command XX to write data to the first and second districts 31a and 31b, and page addresses Add (L), and ADD (R) from the memory controller 17 to the memory device 11, the data DT has been supplied from the memory controller 17 to the NAND flash memory 18 only once.

On the other hand, in the conventional duplexing command sequence shown in FIG. 4, first the write command XX to simultaneously write the same data to the first and second districts 31a and 31b is issued, subsequently the address ADD (L), data DT, and command 11h for the first district 31a are supplied to the NAND flash memory 18. After this, the memory controller 17 supplies in sequence the page address (R), and data DT for the second district 31b to the NAND flash memory 18, and then issues the command 10h.

In the case of the command sequence shown in FIG. 4, it is necessary to supply the same data DT twice from the memory controller 17 to the NAND Flash memory 18.

Figure 5:
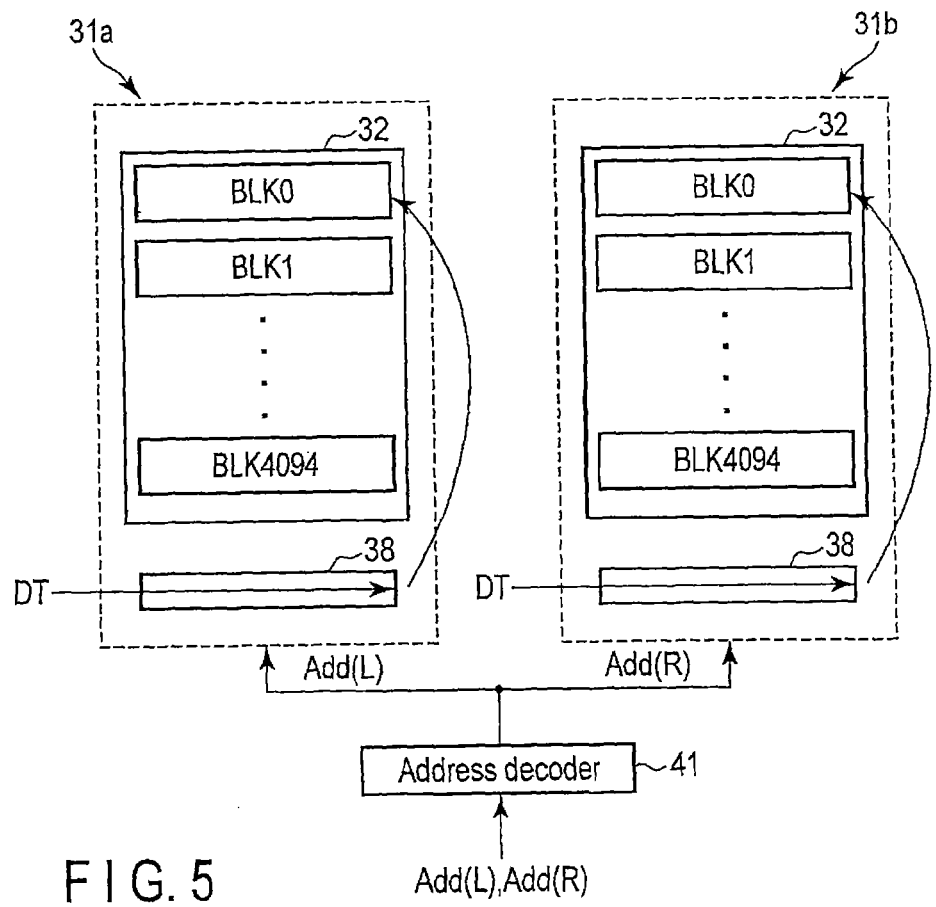
FIG. 5 is a view shown to explain a write operation of first and second districts.

FIG. 5 shows a schematic operation to be carried out when the same data is written to the first and second districts 31a and 31b.

When the write command XX to write data to the first and second districts 31a and 31b, and page addresses Add (L) and Add (R) are supplied from the memory controller 17 to the NAND flash memory 18, the address decoder 41 supplies the page address Add (L) to the first district 31a, and supplies the page address Add (R) to the second district 31b. Further, the data DT supplied to the NAND flash memory 18 is retained in a data register (XDL) 38 of each of the first and second districts 31a and 31b. After this, the data retained in the data register 38 is transferred to each of the logic circuit 39, data registers 37 and 36, and sense amplifier 35, and is simultaneously written to pages designated by the page addresses Add (L) and Add (R).

According to the above-mentioned first embodiment, the write command XX to write the same data DT to the first and second districts 31a and 31b is defined, and the page addresses Add (L) and Add (R) of the first and second districts 31a and 31b, and data DT are supplied in sequence to the NAND flash memory 18 in response to the write command XX, whereby it is possible to simultaneously write the same data to the first and second districts 31a and 31b. Accordingly, it is possible to simultaneously write the same data to the first and second districts 31a and 31b by the single write command XX and, unlike the conventional case, it is not necessary to transfer the same data twice. Accordingly, it is possible to improve the throughput of the write processing.

Further, the same data is simultaneously written to the first and second districts 31a and 31b, and hence it is possible to reduce the probability of the write data being destroyed. Accordingly, the command sequence of this embodiment is effective when data difficult to be re-entered such as photographic data is to be securely preserved.

It should be noted that in this embodiment, although the case where the NAND flash memory 18 is provided with two districts has been described, the description can also be applied to a case where the NAND flash memory 18 is provided with three or more districts in the same manner. Further, when the NAND flash memory 18 receives write data without preparing the particular command to simultaneously write the same data to the first and second districts 31a and 31b, the same data may be simultaneously written to the first and second districts 31a and 31b at all times.

Second Embodiment

Figure 6:
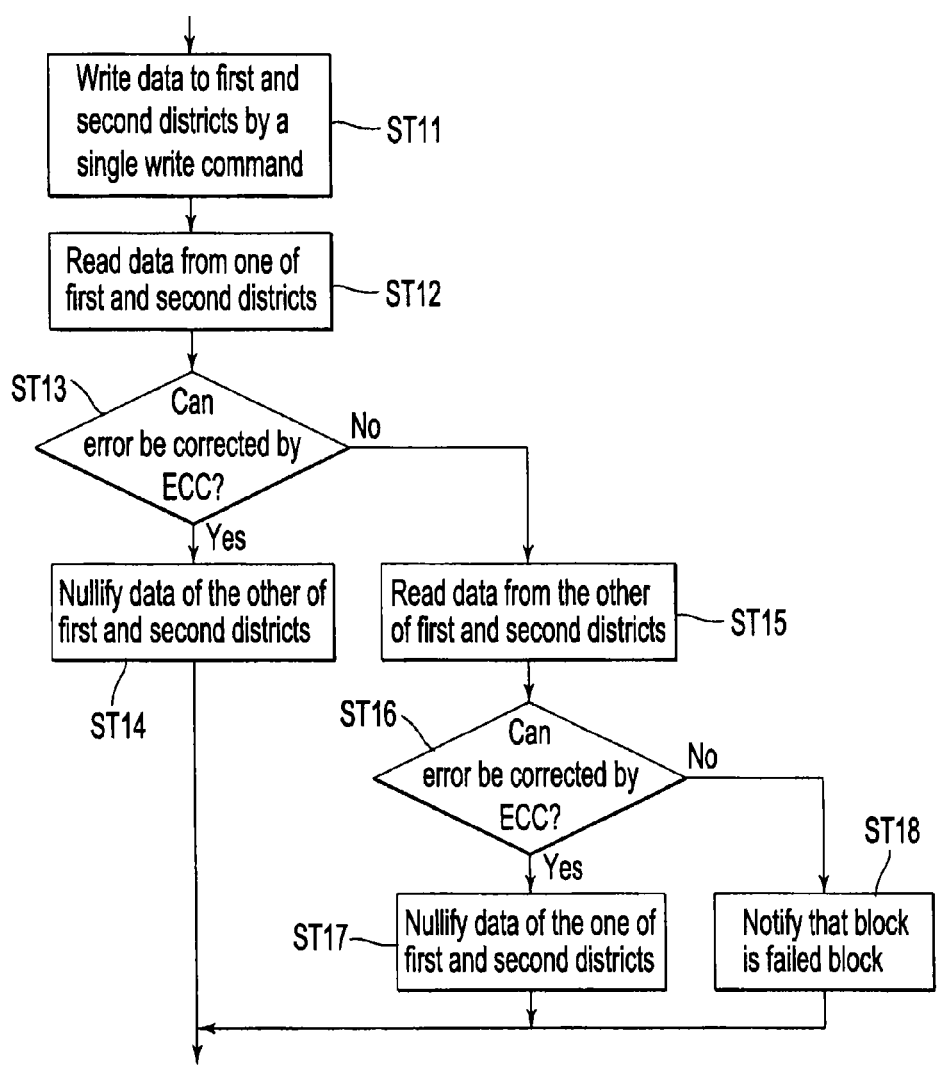
FIG. 6 is a flowchart showing an operation of a second embodiment.

FIG. 6 is a flowchart showing operation of a second embodiment, and shows, for example, an operation of a memory controller 17.

In the first embodiment, the same data DT is written to the first and second districts 31a and 31b by a single write command XX.

Conversely, in the second embodiment, immediately after the same data DT is written to first and second districts 31a and 31b, the data of one of the first and second districts is read and, when the data is normal, the data which has been written to the other of the first and second districts is nullified.

That is, when data is written to the NAND flash memory 18, if data write is completed, status data indicating that data write has normally been completed is output from the NAND flash memory 18. However, even in this case, there occurs a case where data is destroyed with the advance of data write in the block. Whether or not the data is destroyed is determined by reading the data from the NAND flash memory 18. When the data has normally been read, it is determined that the block in which the data is recorded is normal. Accordingly, the data of the district including the block for which it is determined that the block is normal is left as it is, and the block including the same data in the other district is nullified.

More specifically, as shown in FIG. 6, in accordance with the first embodiment, the same data DT is written to the first and second districts 31a and 31b by the single write command XX (ST11).

After this, a read command to read the data DT written to one of the first and second districts 31a and 31b is issued from the memory controller 17. That is, for example, a read command to read the data DT which has been written to the first district 31a is issued, and the data DT which has been written to the first district 31a is read (ST12).

The data DT read from the first district 31a is transferred to the memory controller 17, and is subjected to the error correction processing by the ECC circuit 17a. As a result of the error correction processing, it is determined whether or not the read data is normal. That is, it is determined whether or not an error included in the read data is of such a degree that the error can be corrected (ST13).

When the error is of such a degree that the error can be corrected by using the ECC circuit 17a as a result of the determination, it is determined that the data DT read from the first district 31a is normal data, and the data of the other of the first and second districts 31a and 31b, i.e., in this case, the same data as that of the first district 31a written to the second district 31b is nullified (ST14). That is, the block of the second district 31b, and including the same data as that of the first district 31a is nullified.

On the other hand, in step ST13 described above, when it is determined that the error of the read data is an uncorrectable error, a read command to read the data DT written to the other of the first and second districts 31a and 31b, e.g., the second district 31b is issued, and the data DT written to the second district 31b simultaneously with the first district 31a is read (ST15).

The data DT read from the second district 31b is transferred to the memory controller 17, and is subjected to the error correction processing by the ECC circuit 17a. As a result of the error correction processing, it is determined whether or not the read data is normal. That is, it is determined whether or not the error included in the read data is of such a degree that the error can be corrected (ST16).

When, as a result of the determination, the error is of such a degree that the error can be corrected by the ECC circuit 17a, it is determined that the data DT read from the second district 31b is normal data, and data of one of the first and second districts 31a and 31b, i.e., in this case, the block in which the same data as that of the second district 31b written to the first district 31a, is nullified (ST17).

Further, when, as a result of the determination of step ST16 described above, the error of the read data is an uncorrectable error, both the blocks of the first and second districts 31a and 31b each including the same data are erroneous, and hence the data is recognized as data which cannot be corrected even by this system (ST18).

It should be noted that regarding the nullification of the block carried out by the memory controller 17, it is sufficient if, for example, access to the data is inhibited, and physically deleting the data is not necessary. Further, deletion of data regarded as invalid data is carried out by the memory controller 17 as the need arises.

According to the above-mentioned second embodiment, data DT written to the first and second districts 31a and 31b is read from one of the first and second districts and, when the read data is normal, the block including the data DT written to the other of the first and second districts 31a and 31b is nullified. Accordingly, it is possible to securely write data to one of the first and second districts 31a and 31b by a single command.

For example, in the case where data is to be written to only one of the first and second districts 31a and 31b as in the conventional case, when the data write fails, although it is necessary for the memory controller 17 to issue a write command again, and transfer an address and data to the memory device 11, there is a case where the data has already disappeared from the RAM 15. For example, when the host 20 is a digital still camera, photographed data is lost.

However, in the case of the second embodiment, the case where both the data items written to both the first and second districts are error-uncorrectable rarely occurs, and hence it is possible to securely write data, and improve the throughput of data write.

Moreover, when the data of one of the districts is normal, the block of the other of the districts including the same data is nullified, and is deleted as the need arises, and hence it is possible to prevent the memory capacity from being reduced.

Third Embodiment

In the second embodiment, immediately after the same data is written to each of the designated blocks of the first and second districts 31a and 31b, a read command is issued from the memory controller 17 to read data from a designated block of, for example, the first district 31a and, when there is no error in the read data or when the error can be corrected by ECC processing, it is determined that the data of the first district 31a is normal, and the block of the second district 31b including the same data is nullified.

Conversely, in a third embodiment, immediately after the same data is written to each of first and second districts 31a and 31b, the written data is not read. In the case of the third embodiment, the data written to each of the first and second districts 31a and 31b is regarded as being valid for the time being. That is, both the data items written to the first and second districts 31a and 31b are treated as valid until the data item written to the first or second district 31a or 31b is read.

Figure 7:
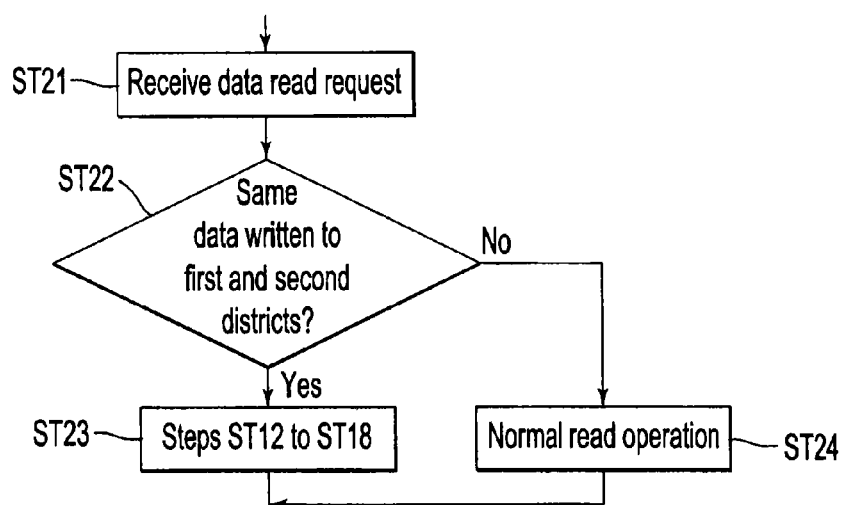
FIG. 7 is a flowchart showing an operation of a third embodiment.

In this state, as shown in FIG. 7, upon receipt of a data read request from a CPU 13 (ST21), a memory controller 17 first determines whether or not the same data is written to the first and second districts 31a and 31b (ST22). In this case, the memory controller 17 preserves, for example, an issuance history of the write command XX, and page addresses, and the preserved page address and a read address are compared with each other.

When, as a result of the above determination, the same data is written to the first and second districts 31a and 31b, the operations of steps ST12 to ST18 shown in FIG. 6 are executed (ST23). That is, data is read from one of the first and second districts 31a and 31b. When the read data is normal, the block including the same data recorded on the other of the first and second districts 31a and 31b is nullified.

Further, when, as a result the determination of above step 22, it is determined that the same data is not written to the first and second districts 31a and 31b, a normal read operation is executed (ST24).

According to the above-mentioned third embodiment, immediately after data is written to the first and second districts 31a and 31b, a data read configured to verify whether or not the written data is normal is not carried out, and hence it is possible to reduce the overhead required for the verification. Accordingly, it is possible to enhance the write speed.

It should be noted that in each of the above-mentioned first to third embodiments, the operation of the NAND flash memory including the first and second districts has been described. However, the embodiments are not limited to the above, and it is needless to say that the above embodiments can be applied to a NAND flash memory including three or more districts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a flash memory including first and second districts, each of which includes a memory cell array; and
a memory controller including an error correction circuit, wherein
the memory controller is configured to issue a write command to the flash memory to simultaneously write first data to both of the first and second districts,
the flash memory is configured to simultaneously store the first data in both of the first and second districts,
the memory controller is configured to issue a read command to the flash memory to read the first data from one of the first and second districts,
the flash memory is configured to output the first data read from the one of the first and second districts to the memory controller,
the memory controller is configured to determine whether or not the first data read from the one of the first and second districts is correctable based on a result of error correction in the error correction circuit, and
the memory controller is configured to perform issuing the write command, and each of issuing the read command and determining whether or not the first data is correctable when executing a data write in reply to the write command.

2. The system according to claim 1, wherein
when the first data read from the one of the first and second districts is correctable, the memory controller is configured to instruct the internal controller to delete the first data written to the other of the first and second districts.

3. The system according to claim 1, wherein
upon receipt of a read instruction from the external host device, the memory controller is configured to determine whether or not the first data has been written to the first and second districts on the basis of a history of write to the first and second districts and, when the first data has been written to the first and second districts, reads the first data from one of the first and second districts.

4. The system according to claim 1, wherein the first district comprises:
a first memory cell array including a plurality of memory cells;
a first row decoder configured to select one of the plurality of memory cells of the first memory cell array; and
a first sense amplifier configured to detect data read from the first memory cell array, and
the second district comprises:
a second memory cell array including a plurality of memory cells;
a second row decoder configured to select one of the plurality of memory cells of the second memory cell array; and
a second sense amplifier configured to detect data read from the second memory cell array.

5. The system according to claim 1, wherein the flash memory includes an address decoder configured to receive first and second addresses, supply the first address to the first district, and supply the second address to the second district.

6. A method of controlling a memory system including a flash memory including first and second districts, the method comprising:
issuing, by a memory controller, a write command to simultaneously write first data to both of the first and second districts, each of which includes a memory cell array,
simultaneously storing, by the flash memory, the first data in both of the first and second districts,
issuing, by the memory controller, a read command to the flash memory to read the first data from one of the first and second districts,
outputting, by the flash memory, the first data read from the one of the first and second districts from one of the first and second districts, to the memory controller,
determining, by the memory controller, whether or not the first data read from the one of the first and second districts is correctable based on a result of error correction in an error correction circuit of the memory controller, and performing, by the memory controller, issuing the write command, and each of issuing the read command and determining whether or not the first data is correctable when executing a data write in reply to the write command.

7. The method according to claim 6, further comprising deleting the first data written to the other of the first and second districts when the first data read from the one of the first and second districts is correctable.

8. The method according to claim 7, further comprising:
determining, when a read instruction is issued from the external host device, whether or not the first data has been written to the first and second districts on the basis of a history of write to the first and second districts;
reading the data which has been written from one of the first and second districts when the first data is written to the first and second districts on the basis of the history of write;
determining whether or not the first data read from the one of the first and second districts, when it is determined that the first data has been written to the first and second districts, on the basis of the history of write, is correctable; and
executing a read operation when the first data is determined not to have been written to the first and second districts on the basis of the history of write.

9. A memory system comprising:
a first memory;
a second memory;
a first memory controller; and
a second memory controller,
wherein
the second memory controller is configured to issue a write command to write first data to both of the first memory and the second memory,
the first memory controller is configured to receive the write command and write the first data to both of the first memory and the second memory,
the second memory controller is configured to issue a read command to read the first data from one of the first memory and the second memory,
the first memory controller is configured to output the first data read from the one of the first memory and the second memory to the second memory controller,
the first memory controller is configured to determine whether or not the first data read from the one of the first memory and the second memory is correctable based on a result of an error correction, and
the first and second memory controllers are configured to perform issuing the write command, and each of issuing the read command and determining whether or not the first data is correctable when executing a data write in reply to the write command.

\* \* \* \* \*